(12) United States Patent
Nakajima

(10) Patent No.: US 8,294,162 B2
(45) Date of Patent: Oct. 23, 2012

(54) LED DEVICE AND LED LIGHTING APPARATUS

(75) Inventor: Toshiyuki Nakajima, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 2 days.

(21) Appl. No.: 12/642,810

(22) Filed: Dec. 19, 2009

(65) Prior Publication Data

US 2010/0157583 A1     Jun. 24, 2010

(30) Foreign Application Priority Data

Dec. 19, 2008    (JP) .................................. 2008-324136

(51) Int. Cl.
*H01L 29/18*  (2006.01)

(52) U.S. Cl. ........................................... 257/88; 438/28

(58) Field of Classification Search ............... 257/88–89, 257/E33.058, E33.059; 362/184; 438/28
See application file for complete search history.

(56) References Cited

U.S. PATENT DOCUMENTS

| | | | |
|---|---|---|---|
| 2007/0069643 A1* | 3/2007 | Brunner et al. | 313/512 |
| 2010/0025700 A1* | 2/2010 | Jung et al. | 257/89 |

FOREIGN PATENT DOCUMENTS

| | | |
|---|---|---|
| JP | 2001-209049 A | 8/2001 |
| JP | 2005-101296 A | 4/2005 |

* cited by examiner

*Primary Examiner* — Shaun Campbell
(74) *Attorney, Agent, or Firm* — Kenealy Vaidya LLP

(57) ABSTRACT

An LED device and an LED lighting apparatus using the same can include a casing including a cavity and at least one pair of LED chips including a first and second LED chips. The LED chips can be adjacently located in the cavity, and an encapsulating resin including a phosphor can be disposed in the cavity so as to encapsulate the LED chips. A light-emitting surface of the first LED chip can be covered with a transparent resin, and therefore color temperatures of light emitted from the first and second LED chips can be located on a substantially black body due to a difference between their distances to the encapsulating resin. Thus, the LED lighting apparatus using the LED device can selectively emit white light having a preferable color temperature that is close to a natural color between the color temperatures by adjusting current applied to the LED chips.

20 Claims, 9 Drawing Sheets

CIE chromaticity diagram

LED DEVICE AND LED LIGHTING APPARATUS

This application claims the priority benefit under 35 U.S.C. §119 of Japanese Patent Application No. 2008-324136 filed on Dec. 19, 2008, which is hereby incorporated in its entirety by reference.

BACKGROUND

1. Field

The presently disclosed subject matter relates to LED (light emitting devices) devices and LED lighting apparatuses, and more particularly to the LED devices that can emit a plurality of substantially natural color lights, and to the LED lighting apparatus using the LED devices that can selectively emit a light mixture with a preferable color tone by using the plurality of natural color lights.

2. Description of the Related Art

Recently, LED devices have been widely used as a light source for general lighting, a back light unit for an LCD (liquid crystal display), a vehicle lamp, etc. One reason for such wide use is that LED devices can emit various color lights including white color light. LED lighting apparatuses that can selectively change a light-emitting color have also been commercialized in order to meet customer needs for matching the light-emitting color to interior decor and atmosphere of a room, as well as to match the light-emitting color of the back light unit to the optical characteristics of various LCD devices, etc.

This is due to customer needs for general lighting that includes a wide range of white light from a white light, of cool color such as a natural light in daytime, to a warm color such as a light of bulb. In addition, white LED devices are basically composed of an LED chip having a peak wavelength towards a short wavelength in the visible light range or an LED chip having a peak wavelength in an ultraviolet light range and an encapsulating resin including a phosphor so that the white LED devices can emit white light by exciting the phosphor with light emitted from the LED chip.

Therefore, white LED devices using phosphor can be subject to various variations in optical characteristics such as color tone (spectrum distribution), brightness, chromaticity, and the like, because of variability in the density of the phosphor in the encapsulating resin, variability of thickness of the encapsulating resin, variability of the spectrum distribution of the LED chip, etc. The optical variations of the white LED devices may also cause various variations in the optical characteristics of LED lighting apparatuses using white LED devices.

Consequently, in general lighting using LED lighting apparatuses, in the back light unit using white LED devices and in other lighting units using white LED devices, these various optical variations may reduce the commercial value of the LED lighting apparatuses. When these white LED devices and LED lighting apparatuses are produced, products that can conform to each specification of general lighting, the back light units and the like can be selected in their manufacturing processes. However, the method may result in increased product cost. To that end, various LED lighting units using white LED devices that can reduce optical variations have been developed.

For example, an LED lighting unit and a LCD apparatus using the same is disclosed in Patent Document No. 1 (Japanese Patent Application Laid Open JP2001-209049). FIG. 8 is a circuit diagram showing a conventional LED lighting unit including an adjustable function for chromaticity, which is disclosed in Patent Document No. 1. The conventional LED light unit includes a plurality of light sources 53.

Referring to FIG. 8, the one light source 53 includes: a white LED 51 made by encapsulating a blue LED chip 50 with an encapsulating resin including a phosphor; an LED chip 52 located adjacent the white LED 51 so that the LED chip 52 (e.g. a yellow LED) can adjust the chromaticity of light emitted from the light source 53 that is based upon the white LED 51; a resistor (r) being electrically connected to the white LED 51 in series in order to determine an LED current of the white LED 51; and a variable resistor (R) being electrically connected to the LED chip 52 in series in order to be able to adjust the chromaticity of the light emitted from the light source 53.

The serial circuit of the white LED 51 and the resistor (r) is connected between a power supply and a ground in parallel along with the serial circuit of the LED chip 52 and the variable resistor (R) for adjusting the chromaticity. In addition, the plurality of light sources 53 is connected between the power supply and the ground in parallel with respect to each other. When the chromaticity of the light source 53 is adjusted, a light intensity of the LED chip 52 is adjusted by changing a current of the LED chip 52 with the variable resistor (R). Therefore, the chromaticity of a light mixture emitted from the plurality of light sources 53 may be adjusted to a favorable chromaticity by adjusting each of the variable resistors R of the light sources 53 while measuring each chromaticity of the plurality of light sources 53.

However, the above-described light sources 53 maintain the white LEDs 51 at a substantially constant light intensity, and the chromaticity of a light mixture of white light emitted from the white LEDs 51 and single color lights emitted from the LED chips 52 may be controlled by adjusting each of the light intensities of the single color lights (e.g. yellow light). In this case, the light intensity of the single color light is controlled by adjusting the current to the LED chip 52. However, the adjustable sensitivity of the light intensity with respect to the current of an LED chip emitting a single color light may be high. Thus, it may be difficult to tweak or adjust the chromaticity of the light mixture of the white lights emitted from the light sources 53.

In addition, the light source 53 includes two kinds of LED chips of which the spectrum distributions are different, and each spectrum of the light mixtures emitted from the plurality of light sources 53 can be subject to a variation with respect to a predetermined spectrum. Therefore, the control process for adjusting the chromaticity of the light mixtures emitted from the light sources 53 may become more difficult due to a complex variation of the respective variations in the light mixtures.

Moreover, when a color temperature of the light mixture emitted from the light sources 53 is located near a black body of a chromaticity coordinate in the CIE chromaticity diagram, the single color light emitted from the LED chip 52 is located far away from the black body of the chromaticity coordinate. Therefore, the color temperature of the light mixture emitted from the light sources 53 cannot be located other than at a position that is close to an intersection of the black body coordinate line and a virtual line between a chromaticity coordinate of the single color light emitted from the LED chip 52 and that of the white light emitted from the white LED 51.

Thus, when the color temperature of the light mixture emitted from the light sources 53 is located on the substantially black body of the chromaticity coordinate so that the light mixture can become a white light that is close to a natural color, the color temperature will be located in a very small area on the black body. Consequently, it may be impossible for the light sources 53 to emit light having a color temperature within a wide range of the substantially black body.

As a measure that emits light having a color temperature on the substantially black body, for example, an LED lighting unit having a variable color temperature is disclosed in Patent Document No. 2 (Japanese Patent Application Laid Open JP2005-101296). If the conventional LED lighting unit is described with reference to FIG. 8, the LED lighting unit includes a first white LED 51 and a second white LED 52, and the first and the second white LEDs 51, 52 are composed of the same blue LED chips.

However, a first encapsulating resin for the first white LED 51 is made by dispersing a yellow phosphor into an epoxy resin, and a second encapsulating resin for the second white LED 52 is made by dispersing the yellow phosphor and an orange phosphor into the epoxy resin. When the white LEDs 51 and 52 are turned on by providing them via the resistors (r) and (R) with the power supply +B, each of white lights having different color temperatures can be emitted from the first white LED 51 and the second white LED 52.

In this case, the white light that is emitted from the first white LED 51 has a color temperature, for instance, between 6000K and 7000K. The white light that is emitted from the second white LED 52 has a color temperature, for example, between 3000K and 4000K. Therefore, the conventional LED lighting unit can selectively emit a light mixture having a color temperature on an approximate line between the respective white chromaticity of these lights emitted from the first white LED 51 and the second white LED 52, which are located close to the black body in the CIE chromaticity diagram by adjusting their current values via resistors (r) and (R).

However, in the above-described conventional LED lighting unit, the phosphor that is included in the first white LED 51 and the phosphor that is included in the second white LED 52 are different. Thus, two mixing processes are required for the epoxy resins and these mixing processes, each using different phosphors are carried out under strict density management. However, it may be unavoidable for some variations to occur in the distribution densities between the epoxy resins and the different phosphors even when trying to control the respective accuracies of the different distribution densities within the ranges of two predetermined densities during the mixing processes.

Thus, in the first encapsulating resin and the second encapsulating resin, an individual variability of the distribution densities between the epoxy resin and the phosphors may occur. The individual variations of these distribution densities may cause respective variations in the optical characteristics such as brightness and wavelength distributions of the light emitted from the first white LED 51 and the second white LED 52.

Therefore, because the light mixture emitted from the LED lighting unit includes the respective light emitted from the first and the second white LEDs 51 and 52, the LED lighting unit may emit a light mixture that includes the respective variations in the optical characteristics such as the brightness and the wavelength distributions of the light emitted from the first and the second white LEDs 51, 52. Thus, it may be difficult for the LED lighting unit to reliably emit light having a favorable color temperature because the color reproducibility in the optical characteristics may be poor even if the color temperature is controlled by the current value.

To resolve the above-described issues, an LED lighting unit and method for manufacturing the same is disclosed in Patent Document No. 3 (Japanese Patent Application No. 2008-279991) by the inventor of the presently disclosed subject matter. FIG. 9 is a cross-sectional view showing the conventional LED lighting unit that is disclosed in Patent Document No. 3. The LED lighting unit 61 includes a first cavity 67 and a second cavity 68 in which the respective depths are different.

The first and the second cavities 67, 68 are formed by a casing 63, which is composed of a first board 66, a second board 65 and a third board 64. The first cavity 67 is formed by through-bores of the second board 65 and the third board 64, and the second cavity 68 is formed by a through-bore of the third board 64. Blue LED chips 62, which are substantially the same, are mounted in the first cavity 67 and the second cavity 68, and a substantially same encapsulating resin including a phosphor is disposed in the first cavity 67 and the second cavity 68.

Therefore, two white lights having different color temperatures can be emitted from the first cavity 67 and the second cavity 68, because the thicknesses of the encapsulating resin including the phosphor is different between the first and second cavities 67, 68. In addition, the variability of the optical characteristics of the white lights can be reduced by using the substantially same LED chips and the substantially same encapsulating resin, and their color temperatures can be located on the substantially black body of the chromaticity coordinate by changing each thickness of the encapsulating resin. Thus, the LED lighting unit can selectively emit light having a favorable color temperature between the color temperatures that are located on the substantially black body using the above-described two white lights.

The above-referenced Patent Documents are listed below, and are hereby incorporated (including their English translations) in their entirety.

1. Patent document No. 1: Japanese Patent Application Laid Open JP2001-209049
2. Patent document No. 2: Japanese Patent Application Laid Open JP2005-101296
3. Patent document No. 3: Japanese Patent Application No. 2008-279991

In the LED lighting unit that is disclosed in Patent document No. 3, although the optical characteristics may be excellent, two kinds of cavities having a different in depth are required to obtain the optical characteristics. Therefore, the manufacturing process may include a process that laminates the third board on the second board.

The disclosed subject matter has been devised to consider the above and other problems, features and characteristics. Thus, an embodiment of the disclosed subject matter can include the LED device that can selectively emit a mixture light having a preferable color temperature between two color temperatures that are close to natural colors using white lights having different color temperatures emitted from a cavity, which can include LED chips and an encapsulating resin including a phosphor in the cavity. In addition, the light mixture emitted from the LED device can maintain high reproducibility of its optical characteristics with stability.

SUMMARY

The presently disclosed subject matter has been devised in view of the above and other problems, features, and characteristics. Another aspect of the disclosed subject matter includes LED lighting apparatuses using the above-described LED device that can selectively emit light having a preferable color temperature that is close to a natural color using stable natural color lights emitted from the LED device so as to match the general lighting, the back light unit for LEDs, etc.

According to an aspect of the disclosed subject matter, an LED device can include a casing having a mounting surface and a cavity, and the cavity including an opening and a bottom surface formed in a substantially flat surface; at least one chip-mounting pad and at least one pair of conductor patterns adjacently located on the bottom surface in the cavity; at least one pair of LED chips composed of a first LED chip and a second LED chip, and formed from a substantially same material with a substantially same structure so as to have a substantially same peak wavelength, the first LED chip including a light-emitting top surface formed in a substantially square that is covered with a transparent resin, and mounted on the at least one chip-mounting pad so that the light-emitting top surface is located toward the opening of the cavity with respect to the chip-mounting pad, and each of electrodes thereof being electrically connected to the at least one chip-mounting pad and one of the at least one pair of conductor patterns, the second LED chip including a light-emitting top surface formed in a substantially square, and located adjacent the first LED chip at a interval on the at least one chip-mounting pad so that the light-emitting top surface of the second LED chip is located toward the opening of the cavity with respect to the chip-mounting pad, and each of electrodes thereof being electrically connected to the at least one chip-mounting pad and the other one of the at least one pair of conductor patterns.

The LED device can also include at least one first electrode and at least one second electrode located adjacent the mounting surface on an outside surface of the casing, and being electrically connected to one of the electrodes of the first and the second LED chips, respectively; at least one third electrode located adjacent the mounting surface, and being electrically connected to the both other ones of the electrodes of the first and the second LED chips; and an encapsulating resin having a top surface composed of a transparent resin and a phosphor, and disposed in the cavity of the casing so as to encapsulate the at least one pair of LED chips therewith, the top surface of the encapsulating resin that is substantially parallel with the bottom surface in the cavity, and wherein the shortest distance between the top surface and a surface toward the encapsulating resin of the transparent resin covering the light-emitting top surface of the first LED chip is configured to become shorter than the shortest distance between the top surface and the light-emitting top surface of the second LED chip.

In the above-described exemplary LED device, the casing can be composed of a first insulating board including the at least one chip-mounting pad and the at least one pair of conductive patterns on a first surface thereof and including the at least one first electrode, the at least one second electrode and the at least one third electrode on a second surface thereof, and a second insulating board including a first surface, a second surface, and a through-bore, and the second surface thereof located on the first surface of the first insulating board so that the at least one chip-mounting pad and the at least one pairs of conductor patterns of the first insulating board are exposed in the through-bore.

In the above-described exemplary LED devices, a plurality of the first LED chips and a plurality of the second LED chips can be alternately arranged in a matrix in a plane on the at least one chip-mounting pad at the substantially same interval. Both light-emitting top surfaces of the first and the second LED chips can be substantially equal to or more than 0.5 square millimeters, and each interval between the adjacent first and second LED chips in the plurality of the first and the second LED chips can be substantially from 0.3 millimeters to 2.0 millimeters. In addition, the pair of LED chips and the phosphor in the encapsulating resin can be one of a blue LED chip and a yellow phosphor, a blue LED chip and a mixture phosphor of a red phosphor and a green phosphor, and a ultraviolet LED chip and a mixture phosphor of a red phosphor, a green phosphor and a blue phosphor.

According to the aspect of the disclosed subject matter, the LED device can emit white lights having different color temperatures from the first and the second LED chips in the cavity of the casing due to a difference of distances between the top surface of the encapsulating resin and the first and the second LED chips. In the case, because the white lights can be emitted using one type of LED chip located adjacent the bottom surface of the cavity and one type of encapsulating resin disposed in the cavity, the variability of the optical characteristics such as brightness, wavelength distribution and the like can be reduced because of the simple structure, and therefore the LED device can emit a light mixture with a preferable white color tone while maintaining high color reproducibility.

Furthermore, the white light emitted from the first and the second LED chips can be close to natural color light because each chromaticity of the white light can be located on the substantially black body in the CIE chromaticity diagram. Therefore, because the LED device can selectively emit white light having a natural color between the color temperatures of the lights emitted from the first and the second LED chips by adjusting driving currents of the LED chips, the disclosed subject matter can provide suitable various LED devices that can be used for a general lighting, as a back light unit for LCDs, as a vehicle lamp, etc.

In another aspect of the disclosed subject matter, an LED lighting apparatus using the above-described LED device can include at least one first resistor having terminals, one of the terminals thereof being electrically connected to the at least one first electrode; at least one second resistor having terminals, one of the terminals thereof being electrically connected to the at least one second electrode; and a constant voltage power supply being electrically connected between the at least one third electrode and the both other ones of the terminals of the at least one first resistor and the at least one second resistor, wherein either one of the at least one first resistor and the at least one second resistor is a variable resistor, and each chromaticity of the pairs of LED chips is adjusted by the variable resistor. In this case, the constant voltage power supply can be replaced with a constant current power supply in series with every pair of LED chips.

According to this aspect of the disclosed subject matter, the adjustment method for the chromaticity of the mixture light emitted from the LED device can become easy as compared to the conventional LED lighting units. Thus, the LED lighting apparatus using the LED device can emit white light having a uniform color tone and a high quality, and can be used for general lighting that required emitting white light having a wide range of color temperature, or a vehicle lamp that can emit light having a natural color, etc.

BRIEF DESCRIPTION OF THE DRAWINGS

The above and other characteristics and features of the disclosed subject matter will become clear from the following description with reference to the accompanying drawings, wherein:

FIG. 2b is a cross-sectional view showing an exemplary interconnection of the LED chips shown in FIG. 2a;

DETAILED DESCRIPTION OF EXEMPLARY EMBODIMENTS

Figure 1:
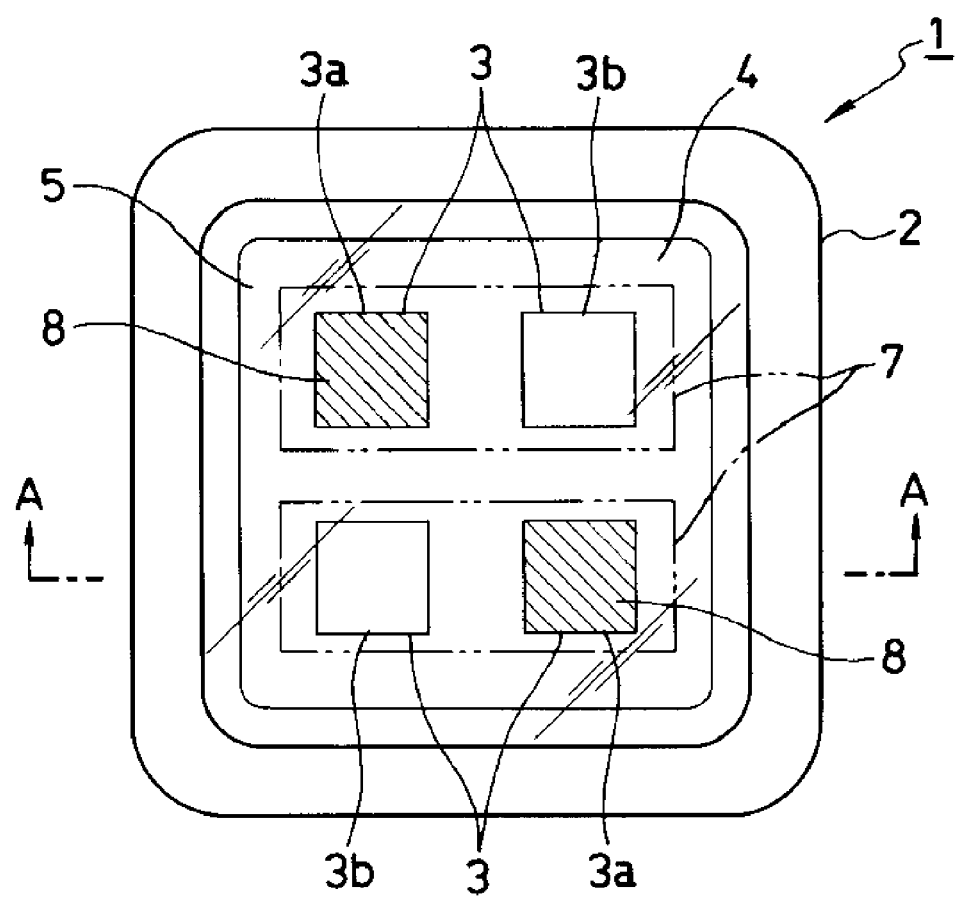
FIG. 1 is a top view showing an exemplary embodiment of an LED device in accordance with the disclosed subject matter.
Figure 2A:
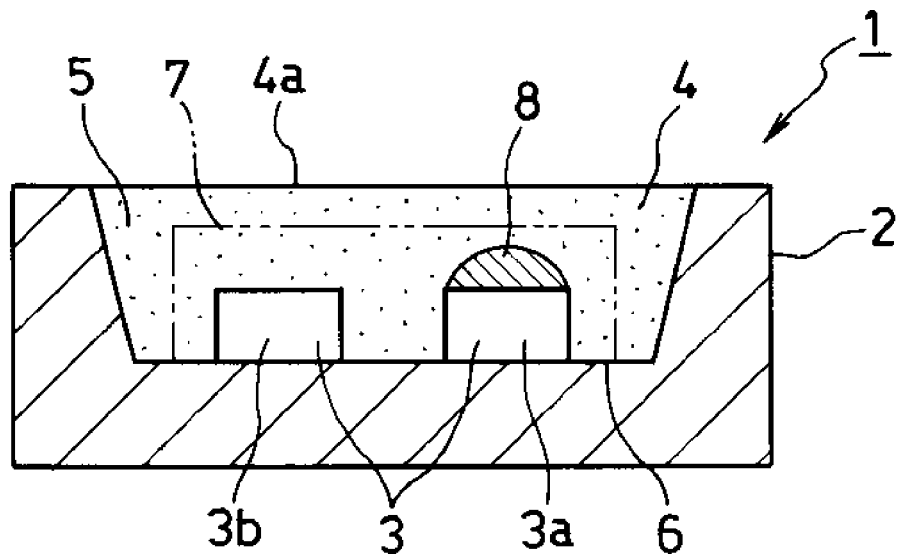
FIG. 2a is a cross-sectional view taken along line A-A of FIG. 1 showing the LED device of FIG. 1.
Figure 2B:
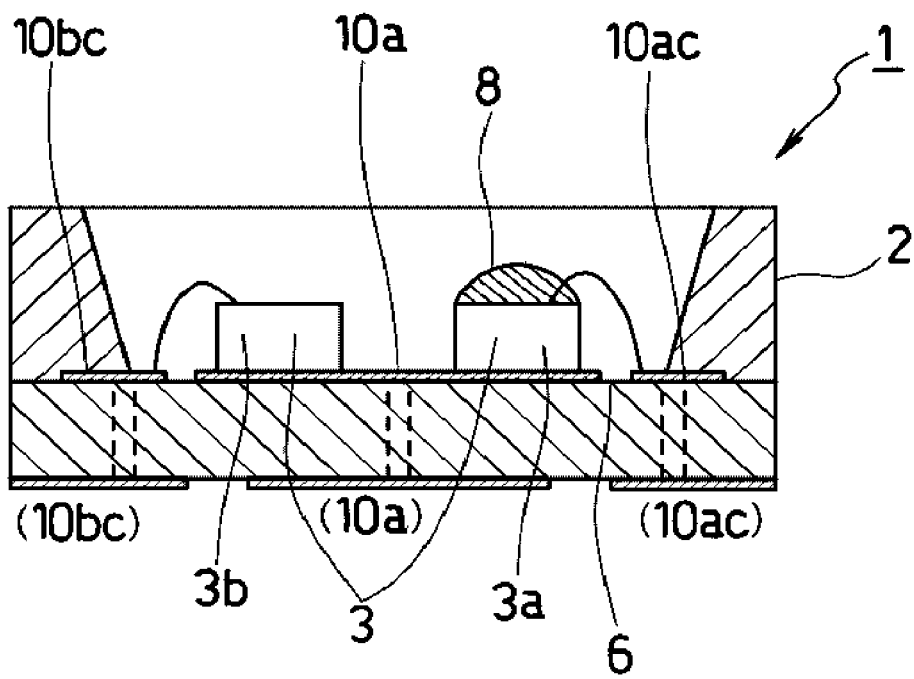

The disclosed subject matter will now be described in detail with reference to FIGS. 1 to 7. In FIGS. 1 to 7, the same or similar elements are listed as the same reference numerals. FIG. 1 is a top view showing an exemplary embodiment of an LED device in accordance with the disclosed subject matter, and FIG. 2a is a cross-sectional view taken along line A-A of FIG. 1, and FIG. 2b is a cross-sectional view showing an exemplary interconnection of the LED chips shown in FIG. 2a.

As shown in FIG. 1, an LED device 1 can include a casing 2 including a cavity 5, a plurality of LED chips 3 mounted in the cavity 5 of the casing 2, and an encapsulating resin 4 encapsulating the plurality of LED chips 3 in the cavity 5. The casing 2 can be made using insulating materials with a high temperature conductivity, such as a metal board that is provided with Au, Al, and the like with an insulating layer thereon or a ceramic substrate, such as $Al_2O_3$, AlN, SiC, $Si_3N_4$ and $ZrO_2$. The casing 2 can include the cavity 5 having a flat bottom surface 6 in a central area thereof. The plurality of LED chips 3 can be located at a favorable interval adjacent the bottom surface 6 of the cavity 5.

A peak wavelength of the LED chips 3 can include a wavelength towards the short wavelength in a visible light range or a wavelength in an ultraviolet light range in order to be able to excite various phosphors with lights emitted from the LED chips 3. Specifically, blue LED chips having a short wavelength in a visible light range, ultraviolet LEDs having a wavelength in an ultraviolet light range and the like can be used as the LED chips 3. The exemplary embodiment of the disclosed subject matter will be described using blue LED chips composed of a GaN-based compound semiconductor as the LED chips 3.

The LED chips 3 can be configured with a substantially same material and a substantially same structure, and therefore the LED chips 3 can include a substantially similar spectrum because of the same type of LED chips. However, the LED chips 3 need not be of the same shape, the same size, the same electrodes structure in a leading structure, a location, a size and the like if their spectrums are the substantially same. An exemplary interconnection of the LED chips 3 will now be given with reference to FIG. 2b.

For example, the ceramic casing 2 can be made by the following processes. An unsintered ceramic plate can be provided with holes, and "via holes" can be formed by providing the holes with a metallic paste such as Au, Ag, Cu, Pb, etc. The metallic paste can be painted on the ceramic plate, and conductor patterns 10a, 10ac, 10bc can be formed by drying the metallic paste on the ceramic plate. Another ceramic plate can be provided with holes for the cavity 5, and can be overlapped with the above ceramic plate via a glass paste. The other ceramic plate can be composed of a ceramic reflective frame in order to efficiently emit light from the cavity 5.

The ceramic plates can be sintered at a desirable temperature, and can be divided into separate structures to form each ceramic package 2. The conductor patterns 10a, 10ac and 10bc can also be extended on a bottom surface of the casing 2 opposite the bottom surface 6 of the cavity 5 via the via holes, and can be soldered on a mounting circuit board when the LED device 1 is mounted on the mounting circuit board. In this case, their extended conductor patterns (10a), (10ac) and (10bc) on the bottom surface of the casing 2 can be used as electrodes of the LED device 1, and the light emitted from the cavity 5 can be directed in a direction perpendicular to the mounting circuit board, that is, a mounting surface of the LED device 1.

The conductor patterns (10a), (10ac), and (10bc) can also be formed by sintering "via holes" that are formed with a metallic paste such as Au, Ag, Cu, Pb, and the like so as to be located in a direction perpendicular to the bottom surface 6 of the cavity 5. In the case, when the conductor patterns (10a), (10ac), and (10bc) are formed by dividing the via holes in order to locate in a direction perpendicular to the bottom surface 6 of the cavity 5 and can be soldered on the mounting circuit board, the LED device 1 can also be used as a side view type device that can emit light in parallel to the mounting circuit board. The LED device 1 of the side view type may be useful as a light source for the back light unit of LCDs The LED chips 3 can include at least one pair of LED chips 7 that includes a first LED chip 3a and a second LED chip 3b. The pair of LED chips 7 having an anode electrode and a cathode electrode can be mounted on the conductor patterns 10a via a conductive adhesive material, and the anode electrodes thereof can be electrically connected to the conductor patterns 10a. Each cathode electrode of the pair of LED chips 7 can be electrically connected to the conductor patterns 10ac and 10bc via bonding wires. The casing 2 can also include a resin formation, and also the conductor patterns can be replaced with lead frames by situating them in or on the casing 2.

A light-emitting top surface of the first LED chip 3a can be configured to include a top coat 8 thereon so as to cover the whole light-emitting top surface. The top coat 8 can be formed from a transparent resin that can transmit at least a light having a wavelength towards a short wavelength in a visible light range or light having a wavelength in an ultraviolet light range. The top coat 8 can be formed by a potting method. For instance, a specific amount of the transparent resin can be dropped on the whole light-emitting top surface by dispensing equipment for dispensing a determinate liquid such as a dispenser and the like, and can be solidified by a heating process as needed. A silicone resin can be used as the transparent resin for the top coat 8 because a viscosity reduction may not occur.

When a resin such as an epoxy resin, whereby the viscosity may be reduce before solidifying is used, the transparent resin for the top coat 8, it is necessary for the resin not to drop towards sides of the first LED chip 3a, particularly when using such an LED chip that a lot of light is emitted from the sides of the first LED chip 3a. The top coat 8 that has a stable shape and a high reproducibility in size can be formed by selecting a transparent resin having a favorable viscosity and accumulation factor and by utilizing the surface tension of the light-emitting top surface.

When an area of the light-emitting top surface is small, the transparent resin may not be easily dropped on the light-emitting surface because a diameter of the nozzle of the dispensing equipment cannot be minimized to sufficiently drop a small enough amount of resin onto the light emitting surface. Therefore, for the first LED chip 3a including the light-emitting top surface that is a square, 500 micrometers or more on a side can be used. In this case, because the LED device 1 using the first LED chip 3a of a large chip size can be driven by a large current, the LED device 1 can emit light with high brightness such that it can be used for general lighting.

The second LED chip 3b of the pair of LED chips 7 cannot include the top coat 8 on the light-emitting top surface thereof. The first LED chip 3a and the second LED chip 3b can be located adjacent the bottom surface 6 of the cavity 5 at a predetermined interval with respect to each other so as not to be eccentrically located. Each of intervals between the adjacent first and second LED chips 3a, 3b can be 0.3 millimeters to 2.0 millimeters. When the interval is less than 0.3 millimeters, productivity may be decreased. When the interval is more than 2.0 millimeters, color variability may occur in the LED device 1.

An encapsulating resin 4 that is made by dispersing a phosphor in a transparent resin can be disposed in the cavity 5, and the first and the second LED chips 3a, 3b including the bonding wires can be encapsulated with the encapsulating resin 4. The encapsulating process that disposes the encapsulating resin 19 in the cavity 5 can be carried out by a potting method and the like so that a top surface 4a of the encapsulating resin 4 can become substantially parallel with the bottom surface 6 of the cavity 5 in the casing 2.

An epoxy resin, a silicone resin and the like can be used as the transparent resin, and a yellow phosphor (e.g. YAG: Ce, $(Ca, Sr, Ba)_2SiO_4:Eu$) that can emit yellow light as a complimentary color of blue light by exciting the phosphor with the blue light emitted from the blue LED can be used, for example, as the phosphor dispersed in the transparent resin. The yellow phosphor can be replaced with a red phosphor (e.g. SrS:Eu) and a green phosphor (e.g. $SrGa_2 S_4:Eu$) that can respectively emit red light and green light by exciting the phosphors with the blue light emitted from the blue LED. Thus the red and/or green phosphors can be used as the phosphors dispersed in the transparent resin so that the mixture light can become the complimentary color of blue light. When the blue LED is replaced with the ultraviolet LED, the red phosphor, the green phosphor and a blue phosphor can be used as the phosphors dispersed in the transparent resin so that the light mixture can emit white light.

Figure 3:
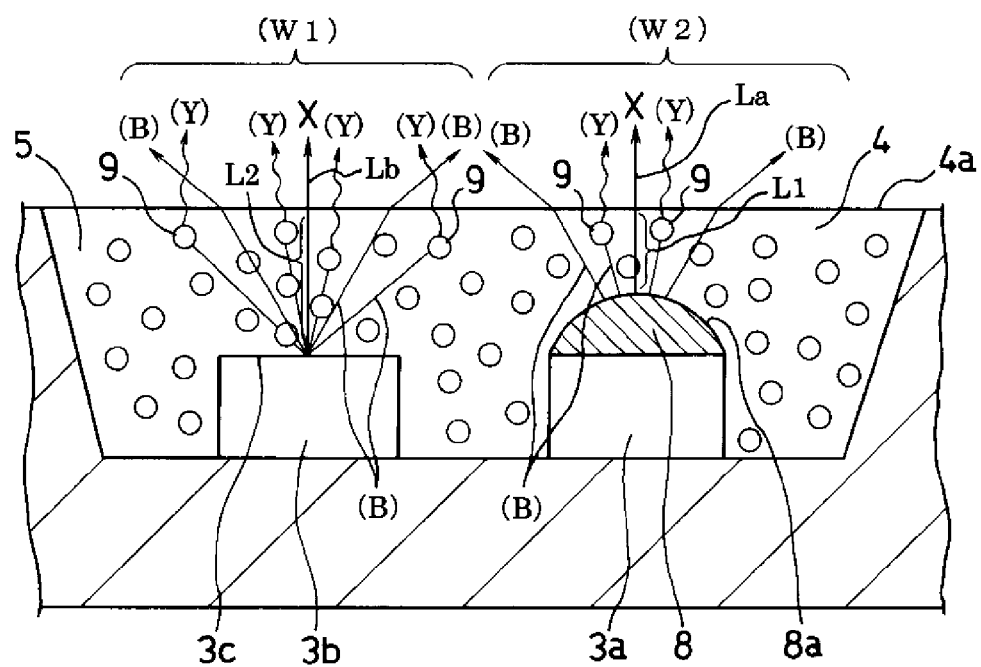
FIG. 3 is a side cross-sectional view for illustrating the optical structure in an exemplary embodiment of the LED device in accordance with the disclosed subject matter.

FIG. 3 is a side cross-sectional view illustrating an optical structure for the exemplary embodiment of the LED device 1. When providing the first LED chip 3a and the second LED chip 3b with a power supply via the above-described conductive patterns 10a, 10ac and 10bc, the first and the second blue LED chips 3a, 3b can emit blue light (B) with a peak wavelength of 450 nm. A part of the blue light (B) emitted from the second LED chip 3b excites the yellow phosphor 9 and converts it to yellow light (Y), which can be mixed with other parts of the blue light (B) emitted from the second LED chip 3b by means of additive color mixture. Thus, the second LED chip 3b can emit light (W1) having an approximately white color tone via the encapsulating resin 4.

On the other hand, light emitted from the first LED chip 3a can enter into the top coat 8, and the light can enter into the encapsulating resin 4 after passing through the top coat 8. A part of the blue light (B) entered into the encapsulating resin 4 via the top coat 8 excites the yellow phosphor 9 and converts it to yellow light (Y), which can be mixed with other parts of the blue lights (B) entered into the encapsulating resin 4 by means of additive color mixture. Thus, the first LED chip 3a can also emit light (W2) having an approximately white color tone via the encapsulating resin 4.

In this case, the chromaticity of the white light (W1) emitted from the second LED chip 3b can be different from that of the white light (W2) emitted from the first LED chip 3a. This is due to a difference between the respective path lengths taken by the blue light (B) emitted in a same direction from the first and the second LED chips 3a, 3b to the top surface 4a of the encapsulating resin 4.

Specifically, when the path lengths of the light emitted in the same direction of an optical axial X from the first and the second LED chips 3a, 3b are compared, if the path length in the encapsulating resin 4 of a blue light La emitted in the direction of the optical axis X from the first LED chip 3a, that is a distance from a surface 8a of the top coat 8 to a surface 4a of the encapsulating resin 4, is defined as L1, and if the path length in the encapsulating resin 4 of a blue light Lb emitted in the direction of the optical axis X from the second LED chip 3b, that is a distance from a light-emitting surface 3c of the second LED chip 3b to a surface 4a of the encapsulating resin 4, is defined as L2, then the path length of Lb can become (L2-L1) longer than that of La.

Therefore, a ratio for exciting the yellow phosphor 9 with the blue light emitted from the second LED chip 3b can become (L2-L1) larger than that for exciting the yellow phosphor 9 with the blue light emitted from the first LED chip 3a. Therefore, a ratio between the yellow light (Y) and the blue light (B) in the white light (W2) emitted from the first LED chip 3a may be different from that in the white light (W1) emitted from the second LED chip 3b. The white light (W1) emitted from the second LED chip 3b may include greater yellow light (Y) than the white light (W2) emitted from the first LED chip 3a, and the white light (W2) emitted from the first LED chip 3a may include greater blue light (B) than white light (W1) from the second LED chip 3b.

That is to say, the white light (W2) includes a high color temperature of blue component which can be emitted from the first LED chip 3a, and the second LED chip 3b can emit white light (W1) including a low color temperature of yellow component. Thus, the first LED chip 3a and the second LED chip 3b can emit different white lights (W2), (W1) having different color temperatures in accordance with an existence of the top coat 8 even when the same blue LEDs having the same spectrums are mounted in the cavities 5 and are encapsulated with the same encapsulating resin 4 having the same compositions.

In addition, because the path length L1 in the encapsulating resin 4 can be changed by changing the height of the top coat 8, the color temperature of the white light (W2) emitted from the first LED chip 3a can be selectively controlled. A top point of the top coat 8 can become higher than the light-emitting surface 3c of the second LED chip 3b, and therefore the distance between the top point of the top coat 8 and the surface 4a of the encapsulating resin 4 can be shorter than that between the light-emitting surface 3c and the surface 4a of the encapsulating resin 4. In order to accomplish the above relation, the heights of the first and the second LED chips 3a, 3b can be substantially same.

Figure 4:
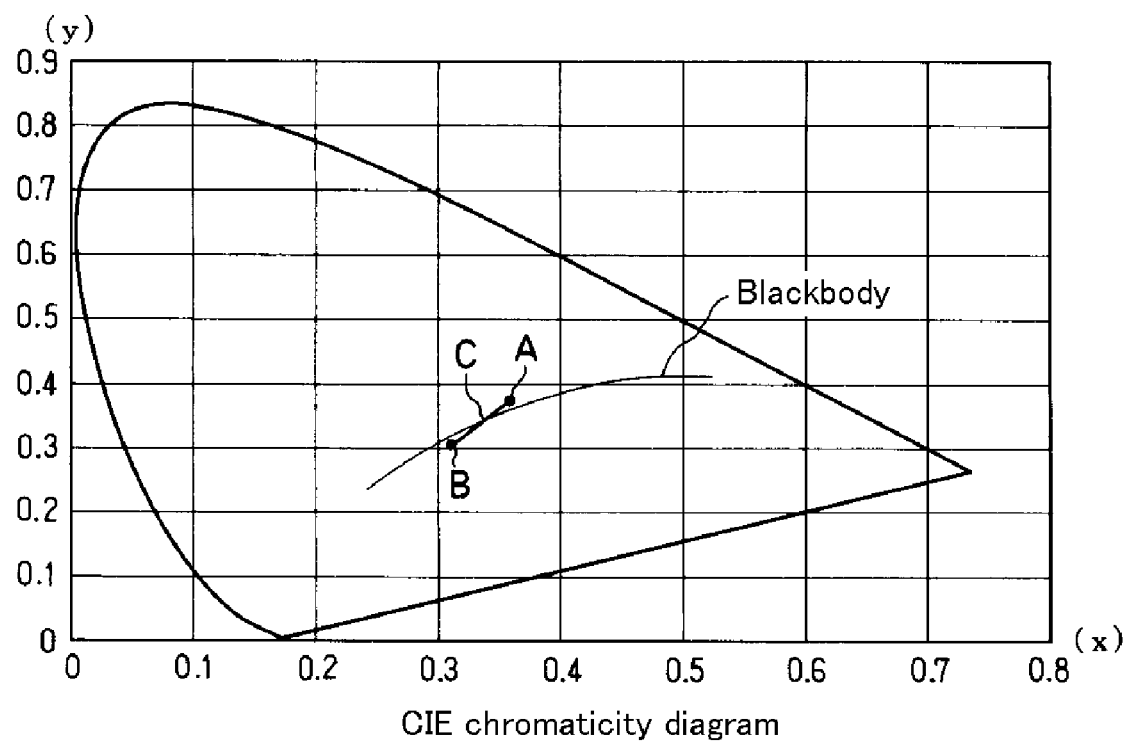
FIG. 4 is a chromaticity diagram showing a chromaticity of the exemplary embodiment of the LED device on a chromaticity coordinate in the CIE chromaticity diagram.

FIG. 4 is a chromaticity diagram showing a chromaticity of the exemplary embodiment of the LED device on a chromaticity coordinate in a CIE chromaticity diagram. When the density of the phosphor 9 in the encapsulating resin 4 is determined so that the color temperature of the white light (W1) emitted from the second LED chip 3b can be located at a point A on the chromaticity diagram, the color temperature of the white light (W2) emitted from the first LED chip 3a can be located at a point B, which is higher than the point A in the relative color temperature.

A mixing ratio of the white lights (W1), and (W2) can be changed by changing the respective currents of the first and the second LED chips 3a, 3b. Thus, the LED device 1 of the disclosed subject matter can selectively emit white light having a preferable color temperature C on a line connected between the points A and B. The length of the line A-B can be changed by the height of the top coat 8.

When the height of the top coat 8 becomes high and therefore the path length (L1) becomes short, because the color temperature of the white light (W2) becomes high and therefore the point B becomes far away from the point A, the line A-B can become long. On the contrary, when the height of the top coat 8 becomes low and therefore the path length (L1) becomes long, because the color temperature of the white light (W2) and therefore the point B becomes close to the point A, the line A-B can become short.

In any case, the line A-B can be an approximate liner line for the black body. Therefore, the LED device 1 can emit a light having a color temperature that is located on the substantially black body, and the light can be a natural color light that is favorable for general lighting, a back light unit for LCDs, etc. Thus, the LED device 1 of the disclosed subject matter can emit the mixture light having a favorable color temperature using the white lights (W2), (W1) emitted from the first and the second LED chips 3a, 3b with a simple structure.

Figure 5:
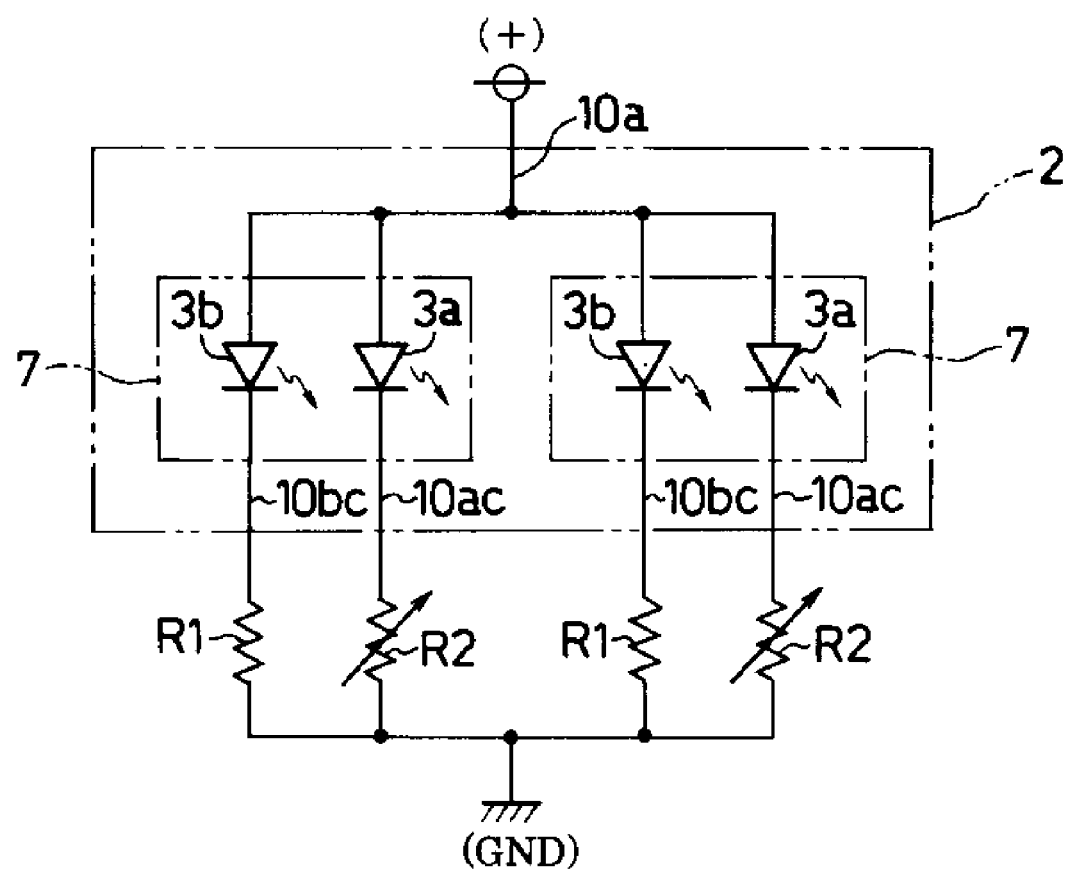
FIG. 5 is a circuit diagram showing an exemplary circuit of an LED lighting apparatus using the LED device in accordance with the disclosed subject matter.

An LED lighting apparatus using the above-described LED device 1 will now be described in detail with reference to FIGS. 5-6. FIG. 5 is a circuit diagram showing an exemplary circuit of an LED lighting apparatus using the LED device made in accordance with principles of the disclosed subject matter. The LED lighting apparatus can be driven by a constant voltage power supply.

The anode electrodes of the first and the second LED chips 3a, 3b can be connected to the power supply via the conductor patter 10a. The cathode electrodes of the first LED chips 3a can be connected to variable resistors R2 via the conductor patterns 10ac. The other terminals of the variable resistors R2 can be connected to the ground. The cathode electrode of the second LED chips 3b can be connected to resistors R1 via the conductor patterns 10bc. The other terminals of the resistors R1 can be connected to the ground.

When the color temperature is adjusted in the LED lighting apparatus shown in FIG. 5, each color temperature of the pairs of LED chips 7 including the first and the second LED chips 3a, 3b can be adjusted so that all the color temperatures of the pairs of LED chips 7 can be located at a substantially same preferable chromaticity coordinate on the CIE chromaticity diagram.

More specifically, at the beginning, all the second chips 3b are turned on by providing them with the power supply while turning off all the first LED chips 3a with the top coat 8 by maximizing the variable resistors R2 or making an open circuit in a circuit of the resistors R2. Each color temperature of the second LED chips 3b is measured, and the highest color temperature can be determined as a lower limit Then, each color temperature of the pairs of LED chips 7 can be adjusted to the substantially same preferable color temperature in higher color temperature area than the lower limit by decreasing each of the variable resistors R2. That is to say, when each color temperature of the pairs of LED chips 7 becomes the substantially the same preferable color temperature by increasing each current of the first LED chips 3a, then each of the variable resistors R2 can be fixed.

Consequently, because each color temperature of all the pair of LED chips 7 can become the substantially same preferable color temperature, the LED lighting apparatus can emit white light having a uniform color tone so that color variations among the pair of LED chips 7 can hardly occur. Thus, the disclosed subject matter can provide LED lighting apparatuses with a high quality that can be used for a general lighting, a back light unit for LCDs, etc.

The above-described adjustment can be useful when the line between the chromaticity of the white light (W1) emitted from the second LED chip 3b and the chromaticity of the white light (W2) emitted from the first LED chip 3a is short. When the line between the respective chromaticity is short, because the substantially same preferable color temperature can be adjusted with a little amount of the white light (W2) emitted from the first LED 3a, the current of the first LED chip 3a can be adjusted by the constant voltage driving method due to the small current. One reason is that bright variations cannot be recognized in the adjustment by the small current of first LED chip 3a because human eyes are sensitive to the color variations but are dull to the bright variation.

Figure 6:
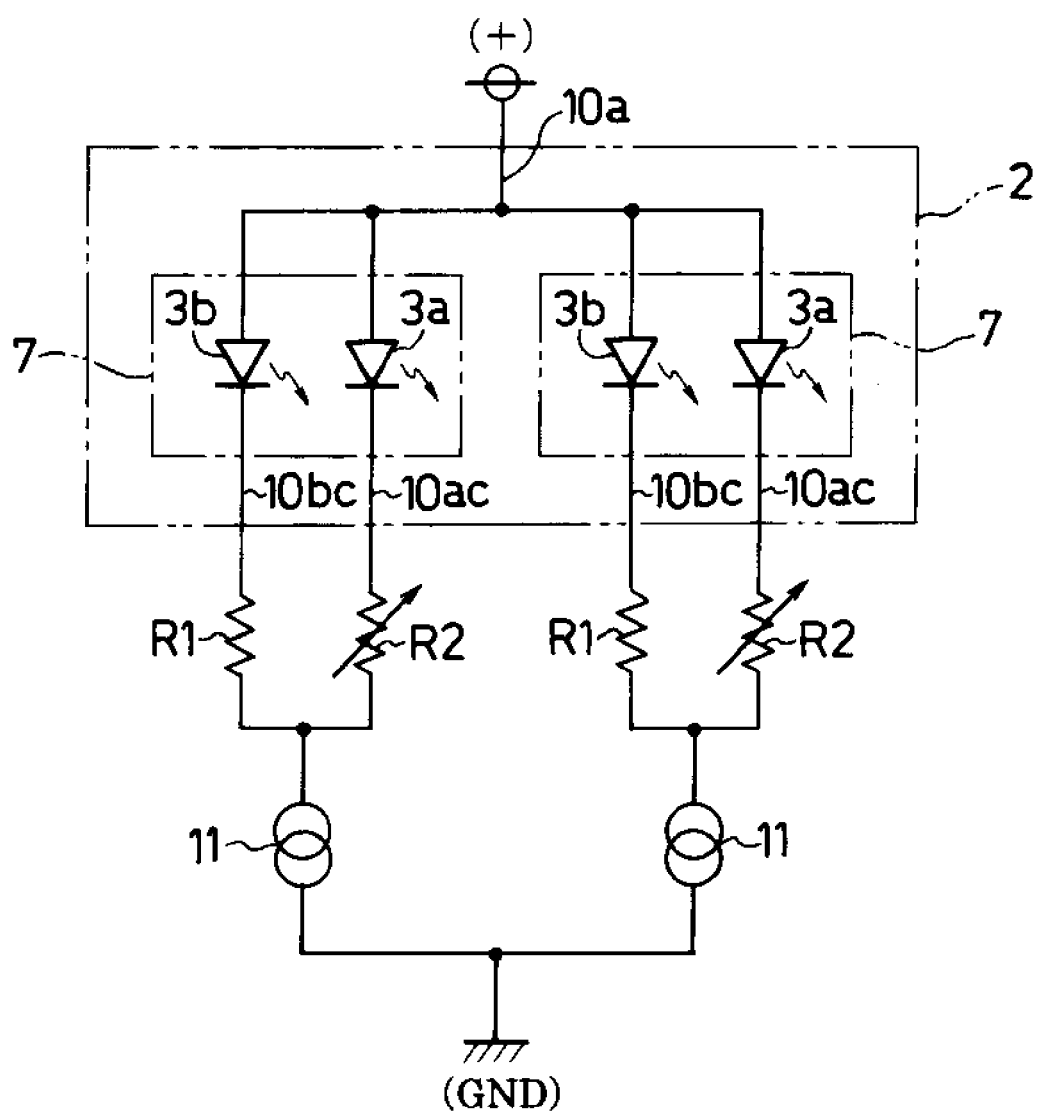
FIG. 6 is a circuit diagram showing another exemplary circuit of an LED lighting apparatus using the LED device.

FIG. 6 is a circuit diagram showing another exemplary circuit of an LED lighting apparatus using the LED device. A difference between the LED lighting apparatuses shown in FIGS. 5 and 6 is a constant current driving method in the apparatus shown in FIG. 6. Each of the pairs of LED chips 7 can be provided with a constant current power supply 11 as shown in FIG. 6. When the color temperature of the LED lighting apparatus shown in FIG. 6 is adjusted, each color temperature of the pairs of LED chips 7 including the first LED chip 3a with the top coat 8 and the second LED chip 3b without the top coat 8 can be adjusted so that each color temperature of the pairs of LED chips 7 can be located at a substantially same preferable chromaticity coordinate on the CIE chromaticity diagram.

Specifically, each initial value of the resistors R1 and the resistors R2 in the pairs of LED chips 7 is roughly determined so that the color temperature of the white lights (W2), (W1) emitted from the first and the second LED chips 3a, 3b can be respectively located at predetermined normal areas that are close to the above-described points B and A, and the approximate ratio of the white lights (W2) and (W1) is determined by the current ratio based upon the initial values of the resistors R1 and R2. Each value of the constant current power supplies 11 can be tweaked if necessary.

After that, each color temperature of the pairs of LED chips 7 can be adjusted to the substantially same preferable color temperature by adjusting each current of the first and the second LED chips 3a, 3b, that is, by changing each of the variable resistors R2. When each color temperature of the pairs of LED chips 7 becomes the substantially same preferable color temperature by adjusting each current of the first and the second LED chips 3a, 3b, each of the variable resistors R2 can be fixed.

Each of the pairs of LED chips 7 in the other exemplary embodiment can be driven by the constant current power supply. Therefore, the amount of the white light (W1) emitted from the second LED chip 3b can increase as the amount of the white light (W2) emitted from the first LED chip 3a decreases due to the decrease of the current value. The first and the second LED chips 3a, 3b can complement the amount of the white light (W2), (W1) with respect to each other.

Therefore, each color temperature of all the pairs of LED chips 7 in the LED lighting apparatus can become the substantially same preferable color temperature while each amount of the white light (W2), (W1) emitted from all the pairs of LED chips 7 is maintained substantially constant. Thus, the disclosed subject matter can provide LED lighting apparatuses with a high quality in which the color variation and the bright variation may hardly occur, and which can be used for a general lighting, as a back light unit for LCDs, a vehicle lamp, etc.

The adjusting method in the circuit shown in FIG. 6 can be useful when the line connected between the chromaticity of the white light (W1) emitted from the second LED chip 3b and the chromaticity of the white light (W2) emitted from the first LED chip 3a is long. When the line between the respective chromaticity is long, that is, each chromaticity of the white lights (W1) and (W2) is located far away with respect to each other, because the amount of the white light (W2) emitted from the first LED 3a may widely change in order to adjust the substantially same preferable color temperature, the current of the first LED chip 3a may widely change.

Therefore, when the above-described color temperature is adjusted by the constant voltage driving method, the brightness variation among the pairs of LED chips 7 may increase. However, when the color temperature is adjusted by the constant current driving method, because the amount of the white lights (W1), (W2) in each of the pairs of LED chips 7 can be substantially constant, the brightness variation among the pairs of LED chips 7 can be avoided.

The above-described adjusting methods are described by adjusting the amount of the white light (W2) emitted from the first LED chip 3a with the top coat 8 via the variable resistor R2. However, the adjusting methods can also be adjusted by changing the amount of the white light (W1) emitted from the second LED chip 3d without the top coat 8 via the resistor R1, which is replaced with a variable resistor. These resistance values can be adjusted by variable resistances, trimming method, etc.

Figure 7:
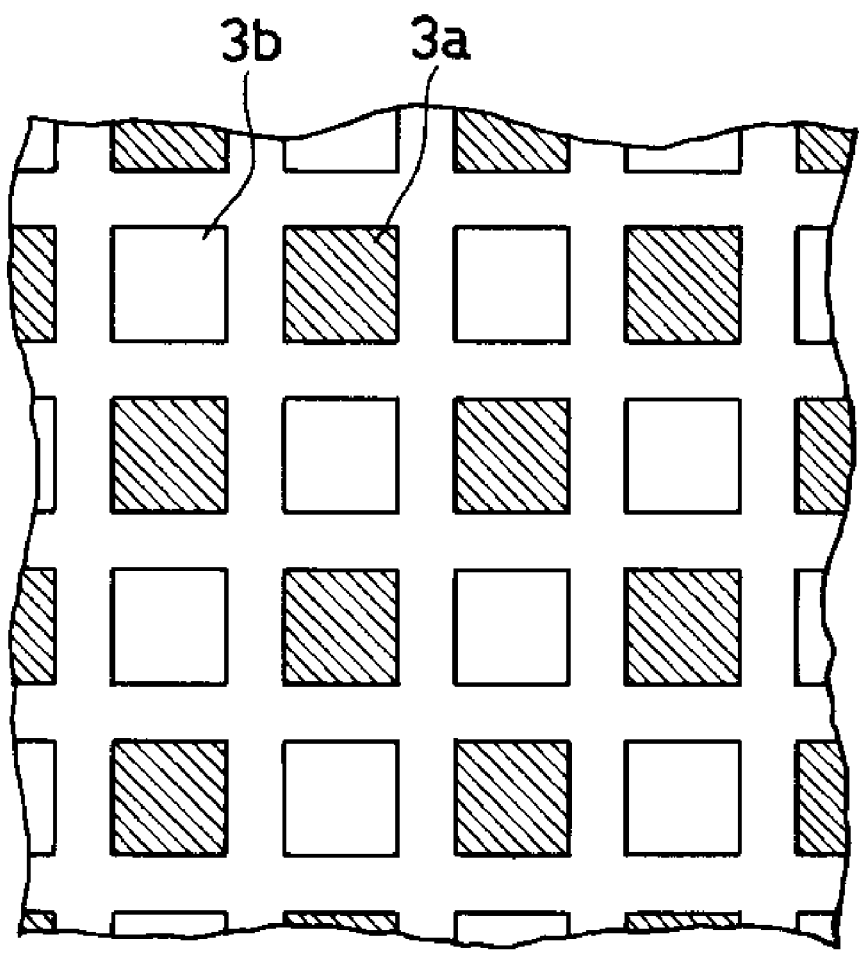
FIG. 7 is a partial top view showing an exemplary embodiment of an LED lighting apparatus using an LED device in accordance with the disclosed subject matter.
Figure 8:
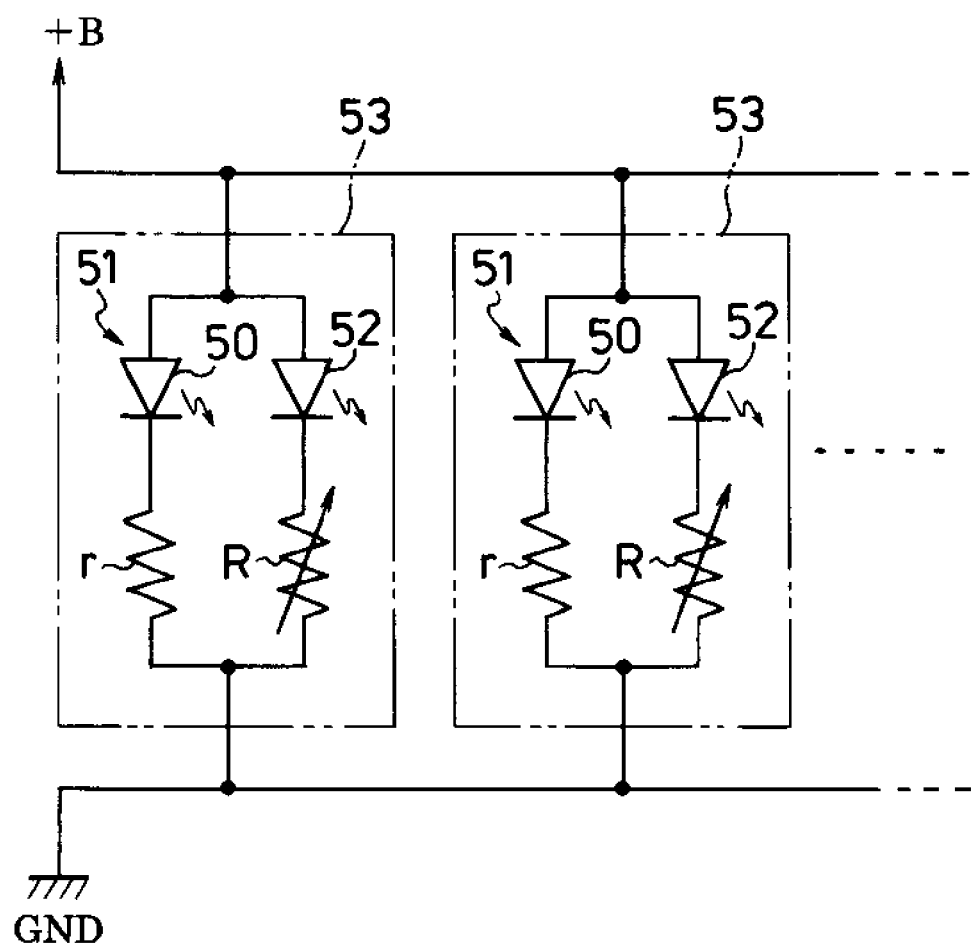
FIG. 8 is a circuit diagram showing a conventional LED lighting unit including an adjustable function for chromaticity.
Figure 9:
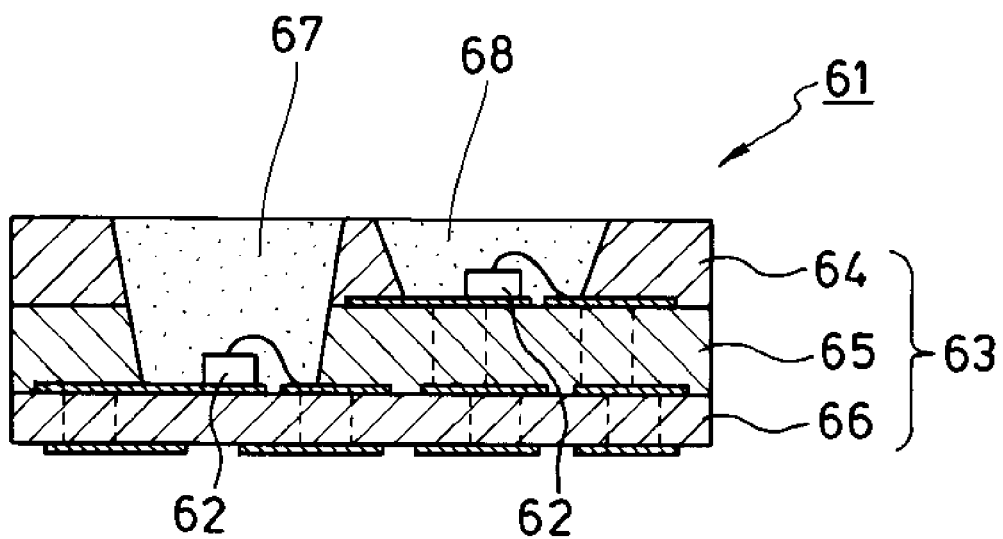
FIG. 9 is a cross-sectional view showing another conventional LED lighting unit.

The above-described exemplary embodiments are described using two pairs of LED chips 7 including the first LED chip 3a with the top coat 8 and the second LED chip 3b without the top coat 8. However, the disclosed subject matter is not limited to the number of the pair of LED chips 7. FIG. 7 is a partial top view showing an exemplary embodiment of the LED lighting apparatus using the LED device. The number of pairs of LED chips 7 can increase at a predetermined interval in both a longitudinal and transverse directions so as to match a light-emitting area. In the case, a plurality of the first and second LED chips 3a, 3b can be located adjacent with respect to each other in order to efficiently mix the white lights (W2), (W1) emitted from the first and the second LEDs 3a, 3b. Thus, the disclosed subject matter can provide the LED lighting apparatuses with a high quality in which the color variation and the bright variation may hardly occur even in a wide area.

As described above, the LED device 1 of the disclosed subject matter can include a plurality of the pair of LED chips 7, including the first LED chip 3a with the top coat 8 and the second LED chip 3b without the top coat 8 at a predetermined interval in the cavity 5, and can include the encapsulating resin 4 including the phosphor 9 to encapsulate the LED chips 3a, 3b in the cavity. The LED lighting apparatuses using the LED device 1 of the disclosed subject matter can emit white light having the substantially same preferable color temperature from all the pairs of LED chips 7 by adjusting either one current of the first and the second LED chips 3a, 3b in each of the pairs of LED chips 7.

A substantially similar type of LED chip can be used as the first and the second LED chips 3a, 3b, and one common type of transparent resin can be used as the top coat 8. In addition, a substantially common type of transparent resin including the phosphor can be used as the encapsulating resin. The first and the second LED chips 3a, 3b can emit white lights having different color temperatures that can be located on the substantially black body in the CIE chromaticity diagram, and the mixture light having a fine color tone can be easily adjusted by controlling the currents of the white lights.

Thus, the LED lighting apparatuses can emit white light having a uniform color tone because the adjustment can be made easy as compared to a conventional LED lighting unit in which the color temperature is adjusted by the single color light of LED. In addition, the LED lighting apparatuses can emit white light having a high quality because the optical variations such as the color variation, the brightness variation, the color reproducibility and the like can be reduced as compared to the other conventional lighting units in which the color temperature is adjusted using the two kinds of encapsulating resins including the different phosphors.

Furthermore, the LED device of the disclosed subject matter can emit white light with a simple structure, in which the white light can be emitted from the first LED chips 3a with the top coat 8 and the second LED chip 3b without the top coat 8 via the one type of the encapsulating resin 4 in the cavity 5. Thus, because the LED chips 3a, 3b can also be located with a high density, the LED device can be used for various LED lighting apparatuses such as a general lighting, as a vehicle lamp, as a back light unit for LCDs and so on.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. An LED device, comprising:

a casing formed from an insulating material and having a mounting surface and a cavity, the mounting surface located on an outside flat surface of the casing, and the cavity including an opening and a bottom surface formed in a substantially flat surface;

at least one chip-mounting pad disposed on the bottom surface in the cavity of the casing;

at least one pair of conductor patterns located adjacent the at least one chip-mounting pad on the bottom surface in the cavity;

at least one pair of LED chips including a first LED chip and a second LED chip, and the at least one pair of LED chips formed from a substantially similar material with a substantially similar structure so as to have a substantially similar peak wavelength, the first LED chip including electrodes, a light-emitting top surface formed in a substantially square shape, and a transparent resin having a surface covering only the light-emitting top surface, wherein the transparent resin transmits light emitted from the first LED chip through the surface of the transparent resin, the first LED chip mounted on the at least one chip-mounting pad so that the light-emitting top surface is located toward the opening of the cavity with respect to the chip-mounting pad, and each of the electrodes of the first LED chip being electrically connected to the at least one chip-mounting pad and one of the at least one pair of conductor patterns, the second LED chip including electrodes and a light-emitting top surface formed in a substantially square shape, the second LED chip located adjacent the first LED chip at an interval and mounted on the at least one chip-mounting pad so that the light-emitting top surface of the second LED chip is located toward the opening of the cavity with respect to the chip-mounting pad, and each of the electrodes of the second LED chip being electrically connected to the at least one chip-mounting pad and an other one of the at least one pair of conductor patterns;

at least one first electrode located adjacent the mounting surface of the casing, and being electrically connected to one of the electrodes of the first LED chip via the one of the at least one pair of conductor patterns;

at least one second electrode located adjacent the mounting surface of the casing, and being electrically connected to one of the electrodes of the second LED chip via the one of the at least one pair of conductor patterns;

at least one third electrode located adjacent the mounting surface of the casing, and being electrically connected to one of the electrodes of the first LED chip and to one of the electrodes of the second LED chip via the at least one chip-mounting pad; and an encapsulating resin having a top surface including a transparent resin and a phosphor, and the encapsulating resin disposed in the cavity of the casing so as to encapsulate the at least one pair of LED chips, wherein the top surface of the encapsulating resin is substantially parallel with the bottom surface in the cavity of the casing, and wherein the shortest distance between the top surface of the encapsulating resin and the surface of the transparent resin covering only the light-emitting top surface of the first LED chip is configured to be shorter than the shortest distance between the top surface of the encapsulating resin and the light-emitting top surface of the second LED chip.

2. The LED device according to claim 1, wherein a plurality of the first LED chips and a plurality of the second LED chips are alternately arranged in a matrix in a plane on the at least one chip-mounting pad at a substantially same interval.

3. The LED device according to claim 1, wherein the light-emitting top surfaces of the first and the second LED chips are substantially equal to or more than 0.5 square millimeters in size, and the interval between the first LED chip and the second LED chip of the at least one pairs of LED chips is substantially from 0.3 millimeters to 2.0 millimeters.

4. The LED device according to claim 2, wherein the light-emitting top surfaces of the first and the second LED chips are substantially equal to or more than 0.5 square millimeters in size, and each interval between the adjacent first and second LED chips in the plurality of the first and the second LED chips is substantially from 0.3 millimeters to 2.0 millimeters.

5. The LED device according to claim 1, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

6. The LED device according to claim 2, wherein the at least one pair of LED chips and the phosphor in the encapsulating resin are one of a blue LED chip and a yellow phosphor, a blue LED chip and a mixture phosphor of a red phosphor and a green phosphor, an ultraviolet LED chip and a mixture phosphor of a red phosphor, a green phosphor and a blue phosphor.

7. The LED device according to claim 3, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

8. The LED device according to claim 4, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

9. An LED device, comprising:

a first insulating board having a substantially uniform thickness and including a first surface and a second surface, at least one chip-mounting pad and at least one pair of conductive patterns located adjacent the first surface, the second surface including at least one first electrode, at least one second electrode and at least one third electrode, the at least one first electrode being electrically connected to one of the at least one pair of conductive patterns through a via-bore, the at least one second electrode being electrically connected to an other one of the at least one pair of conductor patterns through a via-bore, the at least one third electrode electrically connected to the at least one die bonding pad through a via-bore;

a second insulating board having a substantially uniform thickness, the second insulating board including a first surface, a second surface, and a through-bore, and the second surface of the second insulating board being located on the first surface of the first insulating board so that the at least one chip-mounting pad and the at least one pair of conductor patterns of the first insulating board are exposed in the through-bore;

at least one pair of LED chips including a first LED chip and a second LED chip, and the at least one pair of LED chips formed from a substantially same material with a substantially similar structure so as to have a substantially same peak wavelength, the first LED chip including electrodes, a light-emitting top surface formed in a substantially square shape, and a transparent resin having a surface covering only the light-emitting top surface, wherein the transparent resin transmits light emitted from the first LED chip through the surface of the transparent resin, the first LED chip mounted on the at least one chip-mounting pad so that the light-emitting top surface is located toward the through-bore of the second insulating board with respect to the die bonding pad, and each of the electrodes of the first LED chip being electrically connected to the at least one chip-mounting pad and one of the at least one pair of conductor patterns, the second LED chip including electrodes and a light-emitting top surface formed in a substantially square shape, the second LED chip located adjacent the first LED chip at an interval and mounted on the at least one chip-mounting pad so that the light-emitting top surface is located toward the through-bore of the second insulating board with respect to the die bonding pad, and each of the electrodes of the second LED chip being electrically connected to the at least one chip-mounting pad and the other one of the at least one pair of conductor patterns; and an encapsulating resin having a top surface including a transparent resin and a phosphor, and the encapsulating resin disposed in the through-bore of the second insulating board so as to encapsulate the at least one pair of LED chips, wherein the top surface of the encapsulating resin is disposed at substantially the same level as the first surface of the second insulating board, and wherein the shortest distance between the top surface of the encapsulating resin and the surface of the transparent resin covering only the light-emitting top surface of the first LED chip is shorter than the shortest distance between the top surface of the encapsulating resin and the light-emitting top surface of the second LED chip.

10. The LED device according to claim 9, wherein a plurality of the first LED chips and a plurality of the second LED chips are alternately arranged in a matrix in a plane on the at least one chip-mounting pad at a substantially same interval.

11. The LED device according to claim 9, wherein the light-emitting top surfaces of the first and the second LED chips are substantially equal to or more than 0.5 square millimeters in size, and the interval between the first LED chip and the second LED chip of the at least one pair of LED chips is substantially from 0.3 millimeters to 2.0 millimeters.

12. The LED device according to claim 10, wherein the light-emitting top surfaces of the first and the second LED chips are substantially equal to or more than 0.5 square millimeters in size, and each interval between the adjacent first and second LED chips in the plurality of the first and the second LED chips is substantially from 0.3 millimeters to 2.0 millimeters.

13. The LED device according to claim 9, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

14. The LED device according to claim 10, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

15. The LED device according to claim 11, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

16. The LED device according to claim 12, wherein the at least one pair of LED chips and the phosphor in the encapsulating resin are one of a blue LED chip and a yellow phosphor, a blue LED chip and a mixture phosphor of a red phosphor and a green phosphor, and an ultraviolet LED chip and a mixture phosphor of a red phosphor, a green phosphor and a blue phosphor.

17. An LED lighting apparatus using the LED device according to claim 1 further comprising:

at least one first resistor having terminals, one of the terminals being electrically connected to the at least one first electrode;
at least one second resistor having terminals, one of the terminals of the second resistor being electrically connected to the at least one second electrode; and
a constant voltage power supply being electrically connected between the at least one third electrode and the terminals of the at least one first resistor and the at least one second resistor, wherein either one of the at least one first resistor and the at least one second resistor is a variable resistor, and each chromaticity of the pair of LED chips is adjusted by the variable resistor.

18. An LED lighting apparatus using the LED device according to 9 further comprising:

at least one first resistor having terminals, one of the terminals being electrically connected to the at least one first electrode;
at least one second resistor having terminals, one of the terminals of the second resistor being electrically connected to the at least one second electrode; and
a constant voltage power supply being electrically connected between the at least one third electrode and the terminals of the at least one first resistor and the at least one second resistor, wherein either one of the at least one first resistor and the at least one second resistor is a variable resistor, and each chromaticity of the pair of LED chips is adjusted by the variable resistor.

19. An LED lighting apparatus using the LED device according to claim 1 further comprising:

at least one first resistor having terminals, one of the terminals being electrically connected to the at least one first electrode;
at least one second resistor having terminals, one of the terminals of the second resistor being electrically connected to the at least one second electrode; and
at least one constant current power supply being electrically connected in series with the at least one third electrode and the terminals of the at least one first resistor and the at least one second resistor, wherein either one of the at least one first resistor and the at least one second resistor is a variable resistor, and each chromaticity of the pair of LED chips is adjusted by the variable resistor.

20. An LED lighting apparatus using the LED device according to claim 9, comprising:

at least one first resistor having terminals, one of the terminals being electrically connected to the at least one first electrode;
at least one second resistor having terminals, one of the terminals of the second resistor being electrically connected to the at least one second electrode; and
at least one constant current power supply being electrically connected in series with the at least one third electrode and the terminals of the at least one first resistor and the at least one second resistor, wherein either one of the at least one first resistor and the at least one second resistor is a variable resistor, and each chromaticity of the pair of LED chips is adjusted by the variable resistor.

* * * * *